US012707814B2

(12) United States Patent
Lee et al.

(10) Patent No.: US 12,707,814 B2
(45) Date of Patent: Aug. 11, 2026

(54) DISPLAY DEVICE WITH A DRIVING TRANSISTOR INCLUDING GROOVES

(71) Applicant: Samsung Display Co., LTD., Yongin-si (KR)

(72) Inventors: Yong Su Lee, Yongin-si (KR); Seung-Jun Lee, Yongin-si (KR); Jaewoo Lee, Yongin-si (KR); Sung Chan Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 407 days.

(21) Appl. No.: 18/363,953

(22) Filed: Aug. 2, 2023

(65) Prior Publication Data

US 2024/0099064 A1 Mar. 21, 2024

(30) Foreign Application Priority Data

Sep. 15, 2022 (KR) ........................ 10-2022-0116329

(51) Int. Cl.
*H10K 59/12* (2023.01)
*H10K 59/121* (2023.01)

(52) U.S. Cl.
CPC ................................ *H10K 59/1213* (2023.02)

(58) Field of Classification Search
USPC ........................................................... 257/72
See application file for complete search history.

(56) References Cited

U.S. PATENT DOCUMENTS

2006/0284550 A1 12/2006 Takeguchi et al.
2016/0133678 A1 5/2016 Beak et al.
2017/0330928 A1 11/2017 Choi et al.
2018/0358387 A1* 12/2018 Honjo ................ H10K 59/1213
2022/0165824 A1* 5/2022 Kim ..................... H10D 86/411

FOREIGN PATENT DOCUMENTS

CN 105655351 A * 6/2016 ........... G09G 3/3266
JP 2007-5395 A 1/2007
JP 6059968 B2 * 1/2017 ............. H01L 21/44
KR 10-0543011 1/2006
KR 10-2015-0016785 A 2/2015
KR 10-2016-0055670 A 5/2016
KR 10-2017-0129337 A 11/2017
KR 10-2140302 8/2020
KR 10-2020-0138566 12/2020
KR 10-2362092 2/2022
KR 20220041286 A * 4/2022 ............. H10K 59/12

* cited by examiner

*Primary Examiner* — Phuc T Dang
(74) *Attorney, Agent, or Firm* — Sughrue Mion, PLLC

(57) ABSTRACT

A display device includes a semiconductor layer positioned on a substrate and including a driving transistor and a plurality of transistors; a gate conductive layer positioned on the semiconductor layer; and a data conductive layer positioned on the gate conductive layer. The driving transistor has a linear shape in which a plurality of grooves are formed.

20 Claims, 16 Drawing Sheets

FIG. 9

DISPLAY DEVICE WITH A DRIVING TRANSISTOR INCLUDING GROOVES

CROSS-REFERENCE TO RELATED APPLICATION

This application claims priority to and benefits of Korean Patent Application No. 10-2022-0116329 under 35 U.S.C. § 119, filed in the Korean Intellectual Property Office (KIPO) on Sep. 15, 2022, the entire contents of which are incorporated herein by reference.

BACKGROUND

1. Technical Field

The disclosure relates to a display device, and more specifically, to a display device including a driving transistor that is stably driven even at high resolution.

2. Description of the Related Art

A display device is a device that displays an image, and recently, an organic light emitting diode display, which is a type of emissive display device, has been attracting attention.

The emissive display device has a self-emissive characteristic, and unlike a liquid crystal display (LCD), it does not require a separate light source, so a thickness and a weight thereof may be reduced. In addition, the emissive display device exhibits high quality characteristics such as low power consumption, high luminance, and high reaction speed.

In general, the emissive display device includes a substrate, thin film transistors positioned on the substrate, insulating layers disposed between wires constituting the thin film transistors, and an organic light emitting element connected to the thin film transistors.

The emissive display device includes pixels, and each pixel includes transistors. Recently, as a high-resolution display device is used, the size of one pixel is getting smaller.

The above information disclosed in this Background section is only for enhancement of understanding of the background of the invention, and therefore it may contain information that does not form the prior art that is already known in this country to a person of ordinary skill in the art.

SUMMARY

Embodiments provide a display device capable of improving transistor characteristics in a high-resolution display device.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment includes a semiconductor layer positioned on a substrate and including a driving transistor and a plurality of transistors; a gate conductive layer positioned on the semiconductor layer; and a data conductive layer positioned on the gate conductive layer. The driving transistor has a linear shape in which a plurality of grooves are formed.

A region in which the driving transistor overlaps the gate conductive layer in a plan view may form a channel of the driving transistor, and a ratio of a width of the channel of the driving transistor in a first direction to a length of the channel of the driving transistor in a second direction perpendicular to the first direction may be in a range of about 1:3 to about 1:5.

The width of the channel of the driving transistor in the first direction may be about 4 μm or less.

The length of the channel of the driving transistor in the second direction may be in a range of about 8 μm to about 12 μm.

The width of the channel of the driving transistor in the first direction may be in a range of about 2.5 μm to about 4 μm.

The plurality of grooves may be alternately formed along edges of the driving transistor.

A width of each of the plurality of grooves in the second direction may be in a range of about 1 μm to about 2 μm.

A length of each of the plurality of grooves in the first direction may be in a range of about 1 μm to about 2.5 μm.

In the linear shape in which the plurality of grooves are formed, a width of the driving transistor in the first direction may be shorter than a length of each of the plurality of grooves in the first direction.

A length of each of the plurality of grooves in the first direction may be longer than a half of a width of the driving transistor in the first direction.

The plurality of grooves may include a circular groove positioned in a center of the driving transistor.

A diameter of the circular groove may be in a range of about 1 μm to about 3 μm.

The plurality of grooves may include a semicircular groove positioned at an edge of the driving transistor.

A diameter of the semiconductor groove may be in a range of about 2 μm to about 4 μm.

The driving transistor may include a region in which a current is concentrated and a region in which the current is not concentrated. The region in which the current is concentrated and the region in which the current is not concentrated may alternate with each other.

The display device may further include a light blocking layer positioned between the substrate and the semiconductor layer.

The plurality of transistors may include a first transistor, a second transistor, a third transistor, a fourth transistor, a fifth transistor, and a sixth transistor. The driving transistor, the first transistor, the second transistor, the third transistor, the fourth transistor, and the sixth transistor may be included in a pixel.

A length of the pixel in the second direction may be about 35 μm or less.

A length of the pixel in the first direction may be about 70 μm or less.

The display device may further include a light-emitting element electrically connected to the sixth transistor.

According to embodiments, electrical characteristics of a transistor may be improved in a high-resolution display device.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 9 is a schematic view visually showing a flow of a current in a channel of a driving transistor according to the embodiment of FIG. 8;

DETAILED DESCRIPTION OF THE EMBODIMENTS

Figure 1:
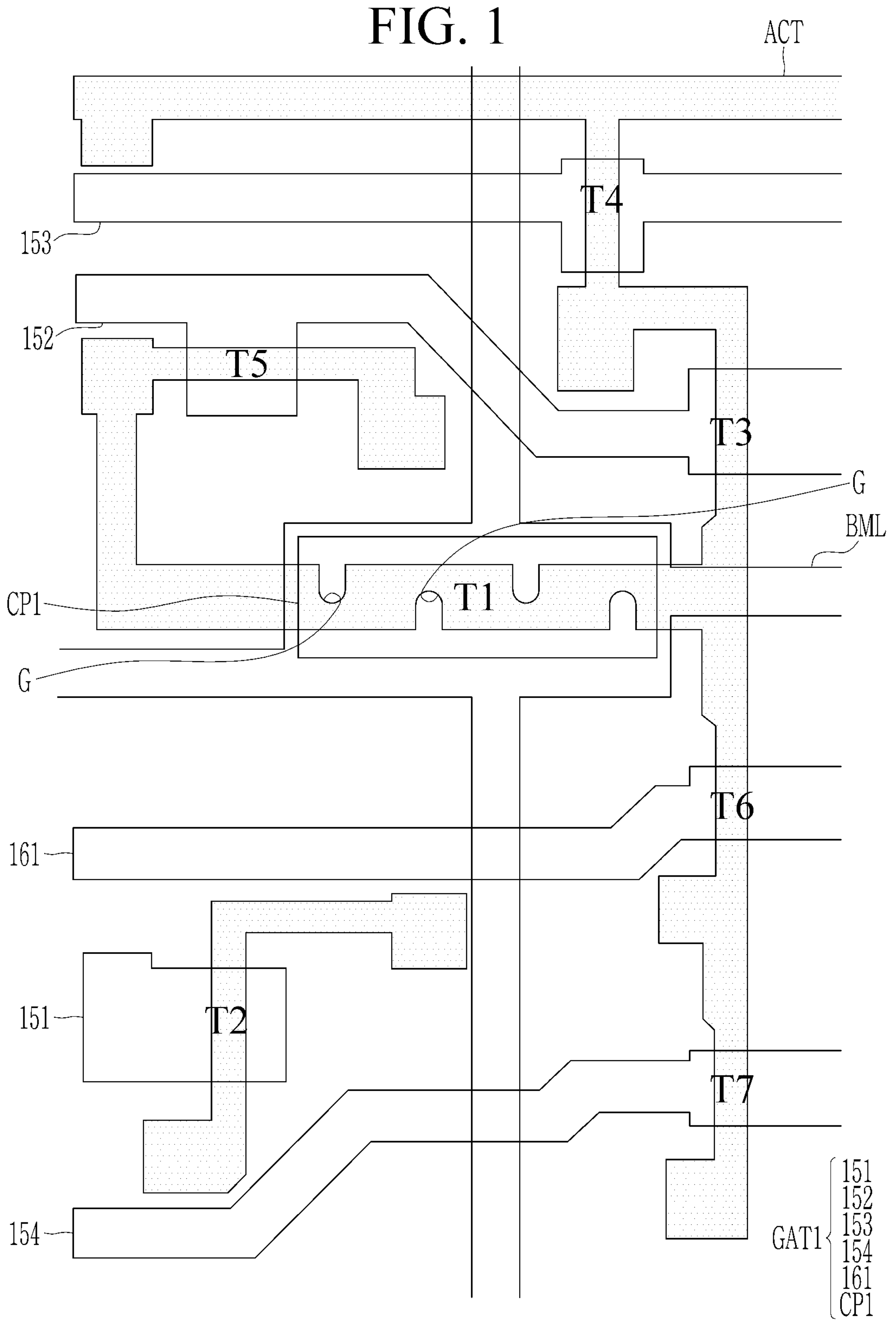
FIG. 1 is a schematic plan view of a pixel of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure. Also, like reference numerals denote like elements.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Further, in the specification, the phrase "on a plane" or "in a plan view" means when an object portion is viewed from above, and the phrase "on a cross-section" or "in a cross-sectional view" means when a cross-section taken by vertically cutting an object portion is viewed from the side.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a display device according to an embodiment is described with reference to accompanying drawings.

FIG. 1 schematically shows a configuration of a light blocking layer BML, a semiconductor layer ACT, and a gate conductive layer GAT1 in a display device according to the embodiment. FIG. 1 is a schematic view for a pixel of a display device according to an embodiment. In FIG. 1, for better comprehension and ease of description, only some components are shown. The overall laminated configuration is described later through a separate drawing.

Referring to FIG. 1, the semiconductor layer ACT may be positioned on the light blocking layer BML. The semiconductor layer ACT may have regions that constitute (or form) a driving transistor T1, a second transistor T2, a third transistor T3, a fourth transistor T4, a fifth transistor T5, a sixth transistor T6, and a seventh transistor T7, respectively. The semiconductor layer ACT may include a polycrystalline semiconductor layer.

The light blocking layer BML may overlap the driving transistor T1 in a plan view. The light blocking layer BML may block light from entering the driving transistor T1, and thus the light may not be irradiated on the driving transistor T1.

Referring to FIG. 1, the driving transistor T1 according to the embodiment has an overall linear shape. This is one of differences from another embodiment in which the driving transistor T1 is bent in a vertical direction (e.g., an S-shape) or curved in a horizontal direction (e.g., an Ω shape). As shown in FIG. 1, the driving transistor T1 may have the linear "I"-shape as a whole, but grooves G may be formed in a channel region of the driving transistor T1. Since the driving transistor T1 has the linear shape including grooves G, even in case that the size of a pixel is reduced at high resolution, an edge current effect due to the size reduction of the driving transistor may be reduced. In the edge current effect, the current flow may be differentiated in the central part and the edge part of the semiconductor layer as the edge field may be concentrated on the edge of the semiconductor layer. The edge current effect may occur in case that the width of the semiconductor layer decreases below a level (e.g., a certain or predetermined level). For example, if the width of the semiconductor layer is narrower than about 4 μm, the edge current effect may be a problem (or may be increased). However, the display device according to the embodiment may reduce the edge current effect by changing the shape of the semiconductor layer even if the width of the semiconductor layer is narrowed (or decreased). The shape and effect of such a driving transistor T1 are described below in detail.

Referring again to FIG. 1, a first gate conductive layer GATT may be positioned on the semiconductor layer ACT. The first gate conductive layer GAT1 may include a first scan pattern 151 for receiving a first scan signal GW (e.g., refer to FIG. 10), a second scan line 152 for transmitting a second scan signal GC (e.g., refer to FIG. 10), a third scan line 153 for transmitting a third scan signal GI (e.g., refer to FIG. 10), a fourth scan line 154 for transmitting a fourth scan signal GB (e.g., refer to FIG. 10), a light emission signal line 161 for transmitting a light emission control signal EM (e.g., refer to FIG. 10), and a first storage pattern CP1 overlapping the driving transistor T1 in a plan view. The first gate conductive layer GAT1 may include at least one of molybdenum (Mo), aluminum (Al), copper (Cu), titanium (Ti), and an alloy thereof, and may have a single-layer or multi-layered structure including the above-described materials.

A channel of each transistor may overlap the first gate conductive layer GAT1. For example, the semiconductor layer ACT may include channels of the driving transistor T1, the second transistor T2, the third transistor T3, the fourth transistor T4, the fifth transistor T5, the sixth transistor T6, and the seventh transistor T7, and the channels may be formed on regions overlapping the first gate conductive layer GAT1 in a plan view.

As described above, the driving transistor T1 of the disclosure may have the linear shape and include the grooves G. However, the driving transistor according to the another embodiment may have a shape bent in a direction (e.g., a certain or selectable direction). The embodiment of FIG. 1 is different from the another embodiment at least in that the driving transistor T1 has the linear shape and includes the grooves G.

Figure 2:
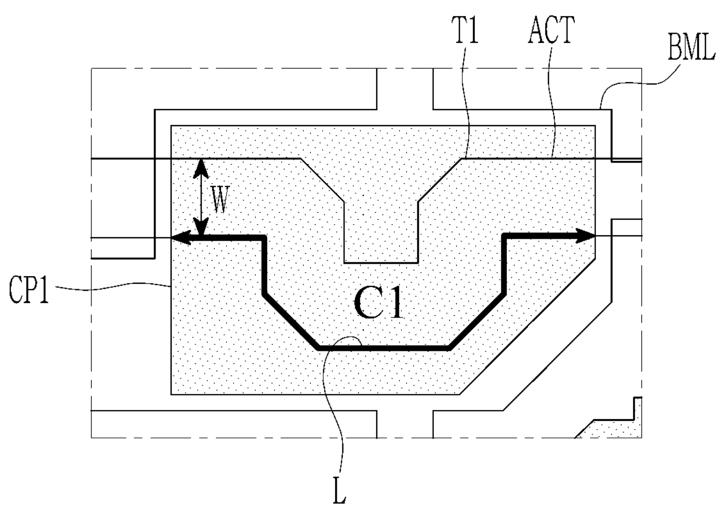
FIG. 2 is a schematic view showing a driving transistor of a display device according to an embodiment.
Figure 3:
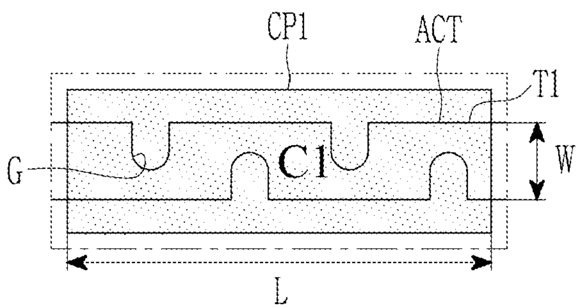
FIG. 3 is a schematic view showing a driving transistor according to the embodiment.

FIG. 2 is a schematic view showing a driving transistor of a display device according to an embodiment. FIG. 3 is a schematic view showing a driving transistor T1 according to the embodiment. In case that the driving transistor T1 is bent as shown in FIG. 2, the flow of the current may be slowed down (e.g., resistance of the driving transistor T1 may be increased). For example, the current may have a characteristic that flows along the shortest distance of the driving transistor T1. Since the driving transistor T1 has the curved shape, heat may be generated due to a current concentration and delay in some regions of the driving transistor T1. The heat may cause a delay during the turning-on of the driving transistor T1, and a DR range may be widened by the delay. As the DR range is widened, the assigned voltage for each gray may be taken widely, and precise luminance expression is possible.

However, as the resolution of the display device increases, the size of the pixel may be decreased. In case that the pixel size is reduced, the size of the driving transistor may also be reduced. If the size of the driving transistor is reduced by a same ratio for the width and the length, the same DR range may be secured. However, the edge current effect due to the size reduction and the resulting hump may occur.

For example, since the current moves along the shortest distance in the semiconductor layer, the current may hardly flow to the edge of the semiconductor layer, and the edge current problem may not be significant. However, in case that the size of the pixel becomes smaller according to high resolution and the width of the semiconductor layer becomes narrower, the current in the semiconductor layer may flow not only to the center of the semiconductor layer but also to the edges. At the edge of the semiconductor layer, the current flow may be different from the central region due to the concentration of the edge field, and a hump may appear in the current characteristic (V-A graph) of the semiconductor layer.

Figure 4:
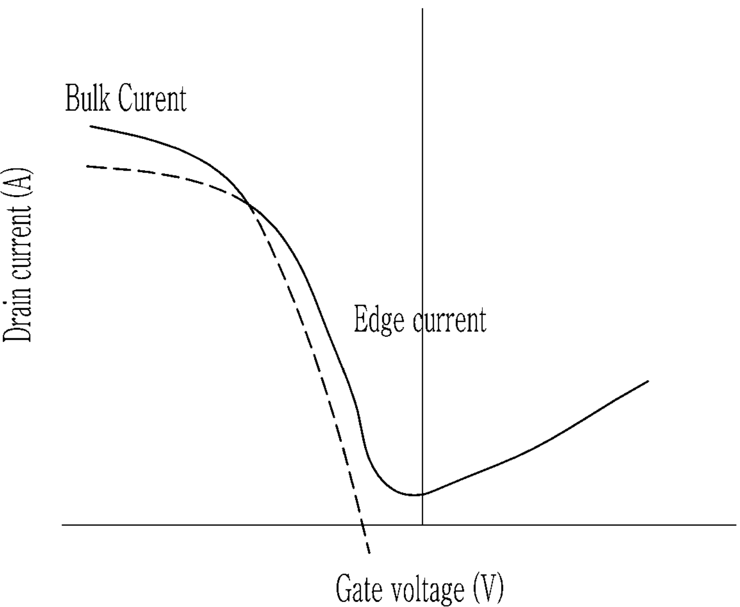
FIG. 4 is a schematic view showing a current hump due to an edge field concentration in a transistor.

FIG. 4 is a schematic view showing a current hump due to an edge field concentration in a transistor. Referring to FIG. 4, the current flow in the edge of the semiconductor layer may be different from the current flow in the center (a bump) of the semiconductor layer.

For example, in case that the driving transistor T1 has a curved shape (the S-shape, the Ω shape), an edge current problem may occur as the size of the pixel becomes smaller at high resolution.

In case that the channel of the width of transistor T1 is about 4 μm or less, the effect of such edge currents may increase. Therefore, in case that the driving transistor T1 has a curved shape, the size of the driving transistor T1 may not be reduced below a level (e.g., a certain or selectable level), and thus, high resolution may be difficult to be realized.

However, in the display device according to the embodiment, the driving transistor T1 may be linear in which the grooves G are formed. Therefore, even if the size of the semiconductor layer becomes small at high resolution, the occurrence of the edge currents may be minimized. The grooves G may be included in the channel of the driving transistor T1, and the wide DR range may be secured. In case that the grooves G are formed in the channel of the driving transistor T1, the curved line of the current may be induced and a delay may occur due to the concentration of the current in an inflection section (e.g., a narrowed section), thereby increasing the DR-range.

Referring to FIG. 3, in the embodiment, a width/length ratio (or a W/L ratio) of the channel C1 of the driving transistor T1 may be in a range of about 1:3 to about 1:5. In FIG. 3, the channel C1 of the driving transistor T1 may be a region overlapping the first storage pattern CP1 in a plan view.

In FIG. 2, in case that the driving transistor T1 is bent, the width/length ratio (the W/L ratio) of the channel C1 may be about 1:6 or greater. In FIG. 2, the channel C1 of the driving transistor T1 may be a region overlapping the first storage pattern CP1 in a plan view, which is the first gate conductive layer.

Figure 5:
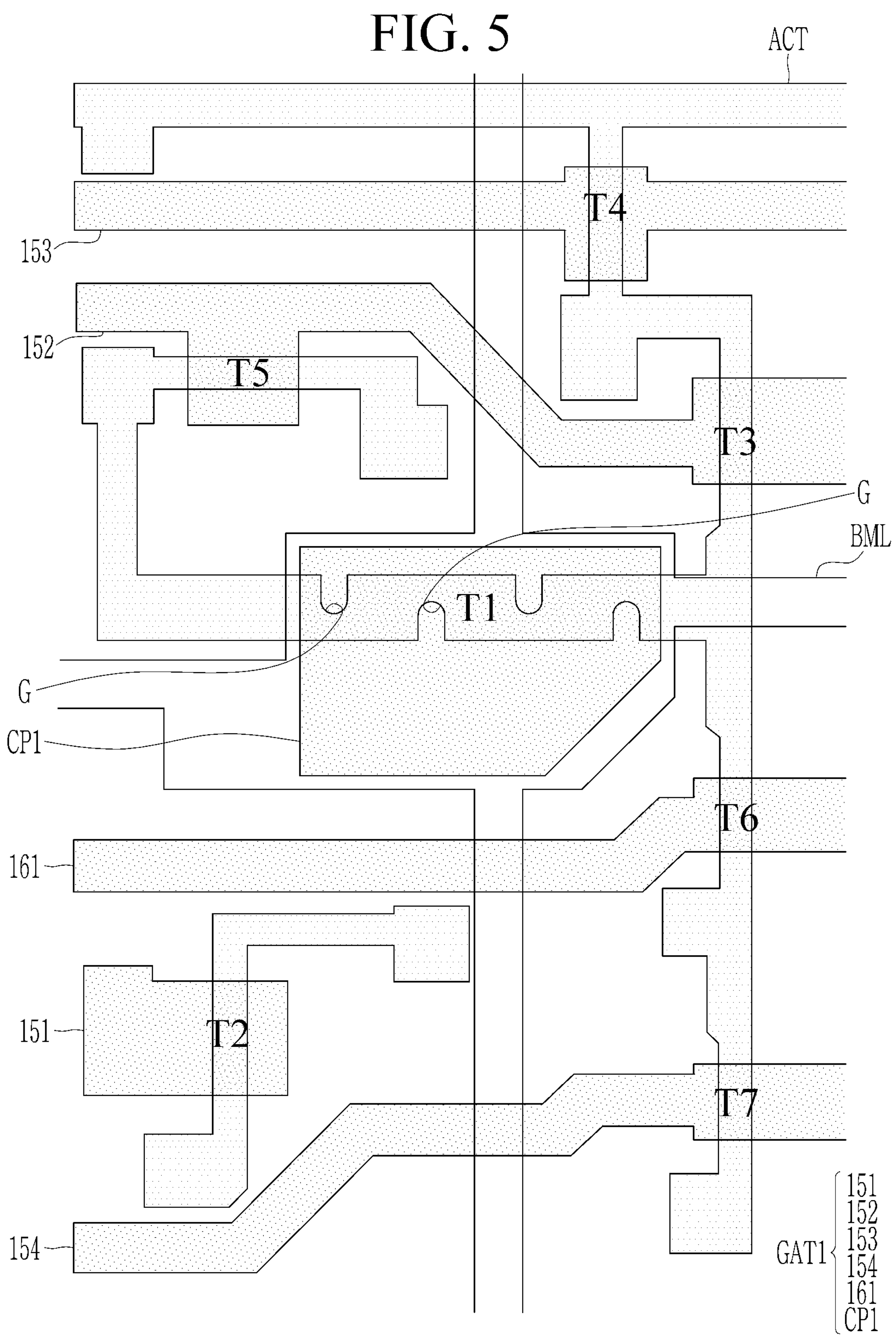
FIG. 5 is a schematic view showing the same region as that of FIG. 1 according to another embodiment.

Referring to FIG. 1, in the embodiment, since the driving transistor T1 is linear and not bent, the area occupied by the driving transistor T1 in a pixel may be reduced, and accordingly, the area of the light blocking layer BML and the first storage pattern CP1 overlapping the driving transistor T1 in a plan view may also be reduced. However, the linear configuration of the driving transistor T1 may be an optional configuration, and even if the area occupied by the driving transistor T1 is reduced, the area occupied by the light blocking layer BML and the first storage pattern CP1 may not decrease. FIG. 5 is a schematic view showing the same region as that of FIG. 1 for another embodiment. The embodiment of FIG. 5 is different from the embodiment of FIG. 5 at least in that the area occupied by the light blocking layer BML. Referring to FIG. 5, in the embodiment of FIG. 5, the area occupied by the light blocking layer BML and the first storage pattern CP1 may be wider than that in FIG. 1

For example, FIG. 5 is an embodiment in which the area occupied by the driving transistor T1 is reduced, but the area occupied by the light blocking layer BML and the first storage pattern CP1 is not reduced. The above-described embodiment may be a configuration for maintaining the capacitor capacitance of the pixel of the display device above a level (e.g., a certain or selectable level).

Figure 6:
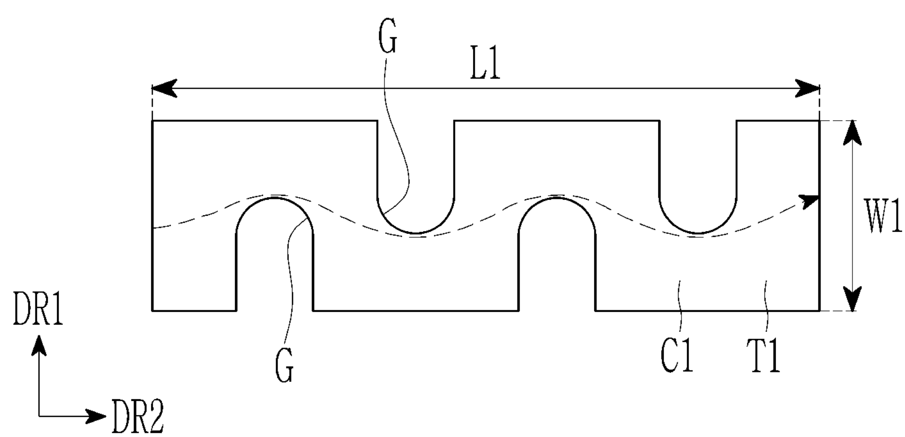
FIGS. 6 and 7 are views showing a channel of a driving transistor according to the embodiment.

FIG. 6 is a schematic view showing a channel C1 of a driving transistor T1 according to the embodiment. Referring to FIG. 6, the channel C1 of the driving transistor T1 may include grooves G alternately positioned on both edges of the channel C1 of the driving transistor T1. The grooves G may be positioned in a zigzag pattern with each other. The current may flow along the shortest distance shown by the dotted line in FIG. 6. Therefore, even if the width W1 of the channel C1 in the first direction DR1 is narrowed to about 4 μm or less, an edge current problem may not occur. A delay may occur in case that the current is concentrated in the inflection section (e.g., the narrowed section) due to the formation of the grooves G, which may increase the DR range.

In FIG. 6, the length L1 of the channel C1 in the second direction DR2 may be in a range of about 8 μm to about 12 μm. The width W1 in the first direction DR1 of the channel C1 may be in a range of about 2.5 μm to about 4 μm. However, these figures are only examples, and the disclosure is not limited thereto.

Figure 7:
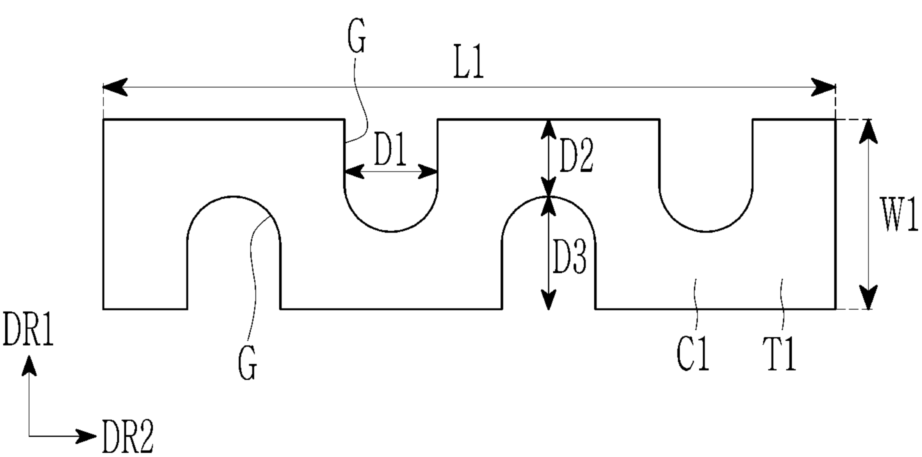

Each of the grooves G may be formed as a curved surface (e.g., a curved arc). For example, the groove G may include a curved surface (e.g., a curved arc). In FIG. 7, the width D1 of the groove G in the second direction DR2 may be in a range of about 1 μm to about 2 μm. Also, the length D3 of the groove G in the first direction DR1 may be in a range of about 1 μm to about 2.5 μm. The width D2 in the first direction DR1 of the channel C1 of the formed region of the groove G may be in a range of about 1 μm to about 2 μm. The length D3 of the groove Gin the first direction DR1 may be longer than the width D2 of the channel of the region where the groove is formed in the first direction DR1. In case that the length D3 of the groove G2 in the first direction DR1 is longer than a half of the width W1 in the first direction DR1 of the channel C1, an inflection section (e.g., a narrowed section) may be formed on the shortest path of the current, and a delay may occur due to the concentration of the current in the inflection section (e.g., the narrowed section). Therefore, the DR range may be increased.

Figure 8:
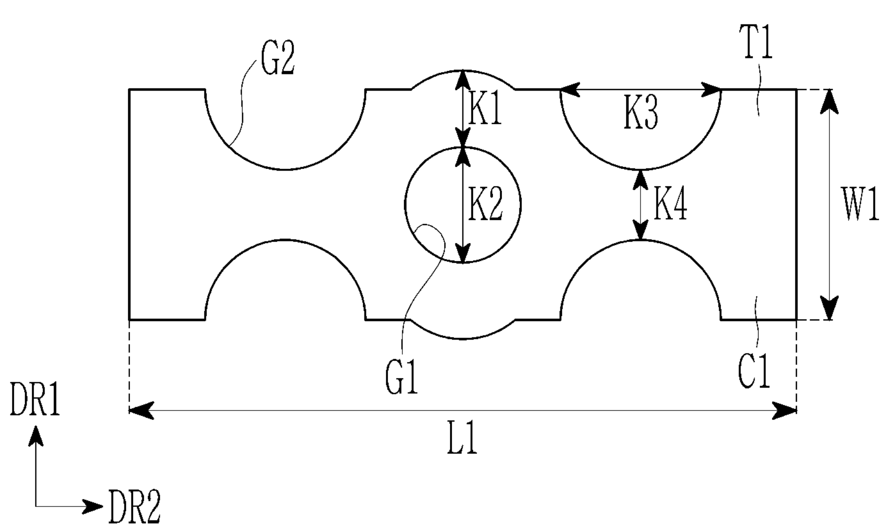
FIG. 8 is a schematic view showing a channel of a driving transistor according to another embodiment.

In the previous embodiment, the configuration in which the grooves G are formed along the edge of the channel C1 has been described, but in an embodiment, the grooves G may also be formed in the center of the channel C1. FIG. 8 is a schematic view showing a channel C1 of a driving transistor T1 according to another embodiment. Referring to FIG. 8, the channel C1 of the driving transistor T1 of the display device according to the embodiment includes a groove G1 positioned at the center of the channel C1 and grooves G2 positioned at the edge of the channel C1. The shape of the groove G1 positioned at the center may be circular, and the shape of the grooves G2 positioned at the edge may be semicircular.

In the embodiment of FIG. 8, the length L1 of the channel C1 in the second direction DR2 may be in a range of about 8 μm to about 12 μm. The width W1 in the first direction DR1 of the channel C1 may be in a range of about 2.5 μm to about 4 μm. However, these figures are merely examples, and the disclosure is not limited thereto.

In the embodiment of FIG. 8, the diameter K2 of the groove G1 positioned at the center of the channel C1 may be in a range of about 1 μm to about 3 μm. Also, the diameter K3 of the groove G2 positioned at the edge of the channel C1 may be in a range of about 2 μm to about 4 μm. The distance K4 between the grooves G2 positioned on the edge of the channel C1 may be in a range of about 1 μm to about 2 μm. The distance K1 in the first direction DR1 between the groove G1 positioned on the center of the channel C1 and the edge of the channel C1 may be in a range of about 1 μm to about 2 μm. These figures are examples, and the disclosure is not limited thereto. As shown in FIG. 8, the edge of the channel C1 parallel to the groove G1 positioned at the center of the channel C1 may have a circular protruded shape.

Figure 9:
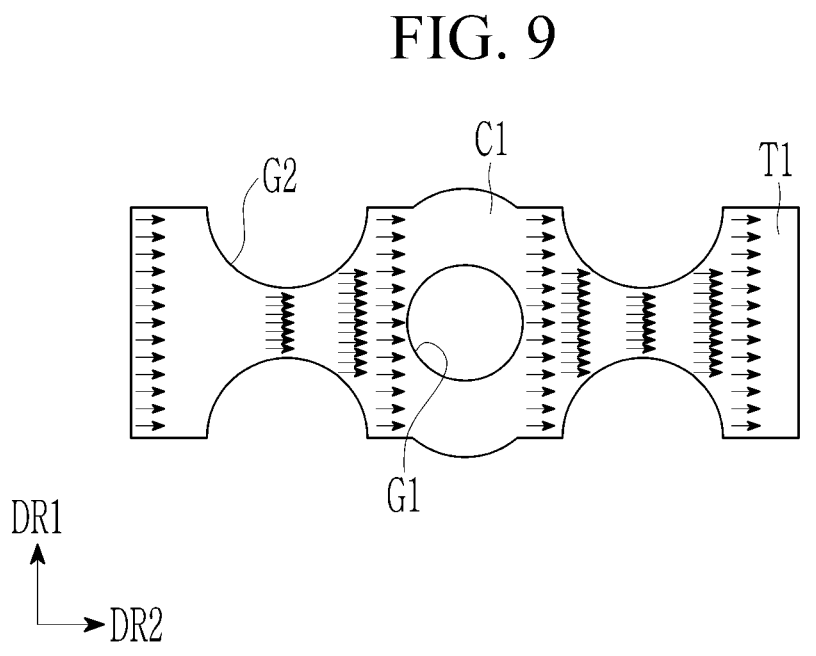

FIG. 9 is a schematic view visually showing a flow of a current in a channel C1 of a driving transistor T1 according to an embodiment of FIG. 8. Referring to FIG. 9, the flow of the current may repeat a mixing (e.g., dissipating or not concentrating) and a concentration by the grooves G1 and G2 formed in the channel C1. For example, the flow of the current may be concentrated between adjacent grooves G2 and may not be concentrated in a region adjacent to the groove G1. Therefore, the edge current effect may be removed, and the driving transistor T1, which is linearly formed, may have the same effect (e.g., a delay induction of the current, an increase in the DR range, or the like) as a driving transistor having a curved shape.

Figure 10:
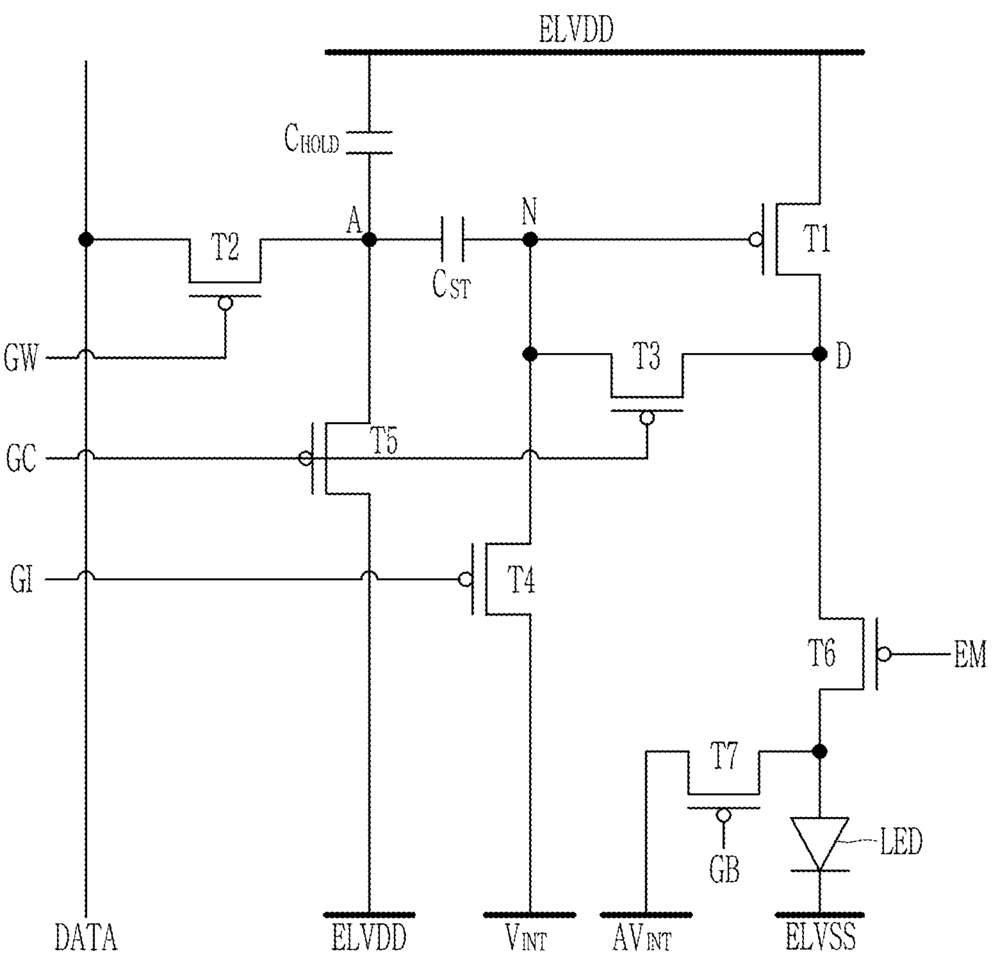
FIG. 10 is a schematic diagram of an equivalent circuit of a pixel included in an emissive display device according to an embodiment.

A display device according to the embodiment is described with reference to a more detailed drawing. FIG. 10 is a schematic view of an equivalent circuit of a pixel included in an emissive display device according to an embodiment. However, the structure described below is only an example, and the disclosure is not limited thereto. If the shape of the driving transistor is linear and the groove is formed, the driving transistor may also be applied to a structure that is different from the structure described below.

Referring to FIG. 10, a pixel may include a light emitting diode LED and a pixel circuit part that drives the LED, and the pixel circuit part may be arranged in a matrix form. The pixel circuit part may include all other elements except for the light emitting diode LED in FIG. 10, and the pixel circuit part of the pixel according to the embodiment of FIG. 1 may include a driving transistor T1, a second transistor T2, a third transistor T3, a fourth transistor T4, a fifth transistor T5, a sixth transistor T6, a seventh transistor T7, a storage capacitor $C_{ST}$, and a hold capacitor $C_{HOLD}$. A first scan line to which a first scan signal GW is applied, a second scan line to which a second scan signal GC is applied, a third scan line to which a third scan signal GI is applied, a light emission signal line to which a light emission control signal EM is applied, and a data line to which a data voltage DATA is applied may be electrically connected to the pixel circuit part. The pixel may receive a driving voltage ELVDD, a driving low voltage ELVSS, a first initialization voltage $V_{INT}$, and a second initialization voltage $AV_{INT}$.

The structure of the pixel, which includes elements (e.g., the transistor, the capacitor, and the light emitting diode LED included in the pixel), is described as follows.

The driving transistor T1 may include a gate electrode electrically connected to a first electrode of the storage capacitor $C_{ST}$, a first electrode (e.g., an input side electrode) electrically connected to the driving voltage ELVDD, and a second electrode (e.g., an output side electrode) that outputs a current according to the voltage of the gate electrode.

The gate electrode of the driving transistor T1 may be electrically connected to a second electrode (e.g., an output side electrode) of the third transistor T3 and a second electrode (e.g., an output side electrode) of the fourth transistor T4 at a node N. The second electrode of the driving transistor T1 may be electrically connected to a first electrode (e.g., an input side electrode) of the third transistor T3 and a first electrode (e.g., an input side electrode) of the sixth transistor T6 at a node D. The output current of the driving transistor T1 may pass through the sixth transistor T6 and be transmitted to the light emitting diode LED. Thus, the light emitting diode LED may emit light. The luminance of the light emitted by the light emitting diode LED may be determined according to the magnitude of the output current of the driving transistor T1.

The second transistor T2 may include the gate electrode electrically connected to the first scan line to which the first scan signal GW is applied, the first electrode (e.g., an input side electrode) electrically connected to the data line to which the data voltage DATA is applied, and the second electrode (e.g., an output side electrode) electrically connected to the second electrode of the storage capacitor $C_{ST}$. The second transistor T2 may allow the data voltage DATA to enter the pixel according to the first scan signal GW and be stored in the storage capacitor $C_{ST}$. For example, the second transistor T2 may control the transmission of the data voltage DATA to a node A based on the first scan signal GW, and the data voltage DATA may be stored in the storage capacitor $C_{ST}$. The second electrode of the second transistor T2 may also be electrically connected to the second electrode (e.g., an output side electrode) of the fifth transistor T5 at the node A.

The storage capacitor $C_{ST}$ may include the first electrode electrically connected to the gate electrode of the driving transistor T1 and the second electrode electrically connected to the second electrode of the second transistor T2, the second electrode of the fifth transistor T5, and the first electrode of the hold capacitor $C_{HOLD}$. The storage capacitor $C_{ST}$ may receive the data voltage DATA output from the second transistor T2 and maintain the voltage (e.g., the data voltage DATA) at the gate electrode of the driving transistor T1. In the pixel of the embodiment, the data voltage DATA may not be directly transmitted to the gate electrode of the driving transistor T1, but the data voltage DATA may be transmitted through the storage capacitor $C_{ST}$. In the method of transmitting the data voltage DATA to the gate electrode of the driving transistor T1 through the storage capacitor $C_{ST}$, in case that the voltage of the second electrode of the storage capacitor $C_{ST}$ suddenly rises, the voltage of the first electrode, which is another electrode, may also rise. According to the above-described method, even if a current leak in the second transistor T2, the voltage of the gate electrode of the driving transistor T1 may not directly leak the leakage current in the second transistor T2. Also, in the embodiment, the data voltage DATA may pass through the storage capacitor $C_{ST}$ without passing through another electrode of the driving transistor T1 and may be transferred (e.g., directly transferred) to the gate electrode of the driving transistor T1. Thus, even if the driving voltage ELVDD may be changed depending on the position of the pixel, the voltage may be stored (e.g., stably stored) in the storage capacitor $C_{ST}$. For example, the stored voltage may not be affected by the difference of the driving voltage ELVDD.

The hold capacitor $C_{HOLD}$ may include the first electrode electrically connected to the second electrode of the storage capacitor $C_{ST}$ and the second electrode to which the driving voltage ELVDD is applied. The first electrode of the hold capacitor $C_{HOLD}$ may be additionally and electrically connected to the second electrode of the second transistor T2 and the second electrode of the fifth transistor T5 at the node A.

Even in case that the surrounding signal changes, the voltage of the second electrode of the storage capacitor $C_{ST}$ may be held by the hold capacitor $C_{HOLD}$. For example, the voltage of the second electrode of the storage capacitor $C_{ST}$ may not be changed by the hold capacitor $C_{HOLD}$ and have a constant voltage.

The third transistor T3 may include the gate electrode electrically connected to the second scan line to which the second scan signal GC is applied, the first electrode (e.g., an input side electrode) electrically connected to the second electrode of the driving transistor T1, and the second electrode (e.g., an output side electrode) electrically connected to the first electrode of the storage capacitor $C_{ST}$. The third transistor T3 may form a compensation path for compensating the threshold voltage of the driving transistor T1, and the threshold voltage of the driving transistor T1 may be transmitted to the first electrode of the storage capacitor $C_{ST}$ to be compensated. As a result, even if the threshold voltage of the driving transistor T1 included in each pixel is different (or is changed), the driving transistor T1 may output a constant output current according to the applied data voltage DATA. The second electrode of the third transistor T3 may also be electrically connected to the second electrode of the fourth transistor T4.

The fourth transistor T4 may include the gate electrode electrically connected to the third scan line to which the third scan signal GI is applied, the first electrode to which the first initialization voltage $V_{INT}$ is applied, and the second electrode electrically connected to the first electrode of the storage capacitor $C_{ST}$ (or the gate electrode of the driving transistor T1 or the second electrode of the third transistor T3). The fourth transistor T4 may initialize the first electrode of the storage capacitor $C_{ST}$ and the gate electrode of the driving transistor T1 to the first initialization voltage $V_{INT}$.

The fifth transistor T5 may include the gate electrode electrically connected to the second scan line to which the second scan signal GC is applied, the first electrode to which the driving voltage ELVDD is applied, and the second electrode electrically connected to the second electrode of the storage capacitor $C_{ST}$, the first electrode of the hold capacitor $C_{HOLD}$, and the second electrode of the second transistor T2 at the node A.

The sixth transistor T6 may include the gate electrode electrically connected to the light emission signal line to which the light emission control signal EM is applied, the first electrode (e.g., an input side electrode) electrically connected to the second electrode of the driving transistor T1, and the second electrode (e.g., an output side electrode) electrically connected to the anode of the light emitting diode LED. The first electrode of the sixth transistor T6 may be also electrically connected to the first electrode of the third transistor T3, and the second electrode of the sixth transistor T6 may also be electrically connected to the second electrode of the seventh transistor T7. The sixth transistor T6 may transmit or block the output current of the driving transistor T1 to and/or from the light emitting diode LED based on the light emission control signal EM.

The seventh transistor T7 may include the gate electrode electrically connected to a fourth scan line to which a fourth scan signal GB is applied, a first electrode to which a second initialization voltage $AV_{INT}$ is applied, and a second electrode electrically connected to an anode of a light emitting diode LED. The second electrode of the seventh transistor T7 may also be electrically connected to the second electrode of the sixth transistor T6. The seventh transistor T7 may initialize the anode of the light emitting diode LED with the second initialization voltage $AV_{INT}$.

In the embodiment of FIG. 10, all transistors may be formed using a polycrystalline semiconductor and may be doped with doping particles (or material) of a same type. In the embodiment of FIG. 10, the embodiment in which all transistors are doped with the P-type has been disclosed, but the disclosure is not limited thereto.

The light emitting diode LED may include the anode electrically connected to the second electrode of the sixth transistor T6 and the cathode electrically connected to the driving low voltage ELVSS. The light emitting diode LED may be electrically connected between the pixel circuit part and the driving low voltage ELVSS to emit light with a luminance corresponding to the current supplied from the pixel circuit part (e.g., the driving transistor T1). The light emitting diode LED may include an emission layer including at least one of an organic light emission material and an inorganic light emission material. Holes and electrons may be injected into the emission layer from the anode and the cathode, respectively, and excitons of which the injected holes and electrons are combined may fall from an excited state to a ground state. Thus, the light may be emitted. The light emitting diode LED may emit at least one light of primary colors and white light. Examples of the primary colors may include three primary colors of red, green, and blue. Other examples of primary colors may include yellow, cyan, and magenta. According to the embodiment, the pixel may further include an additional color filter or a color conversion layer, and the display characteristic of the color may be improved.

Hereinafter, the arrangement of the pixel according to an embodiment of the disclosure is described with reference to FIGS. 11 to 17. FIGS. 11 to 16 are schematic views showing a stacked structure of a pixel according to an embodiment of the disclosure step by step. FIG. 17 is a schematic cross-sectional view taken along line XVII-XVII' of FIG. 16.

However, the structure described below is only an example, and the disclosure is not limited thereto.

Figure 11:
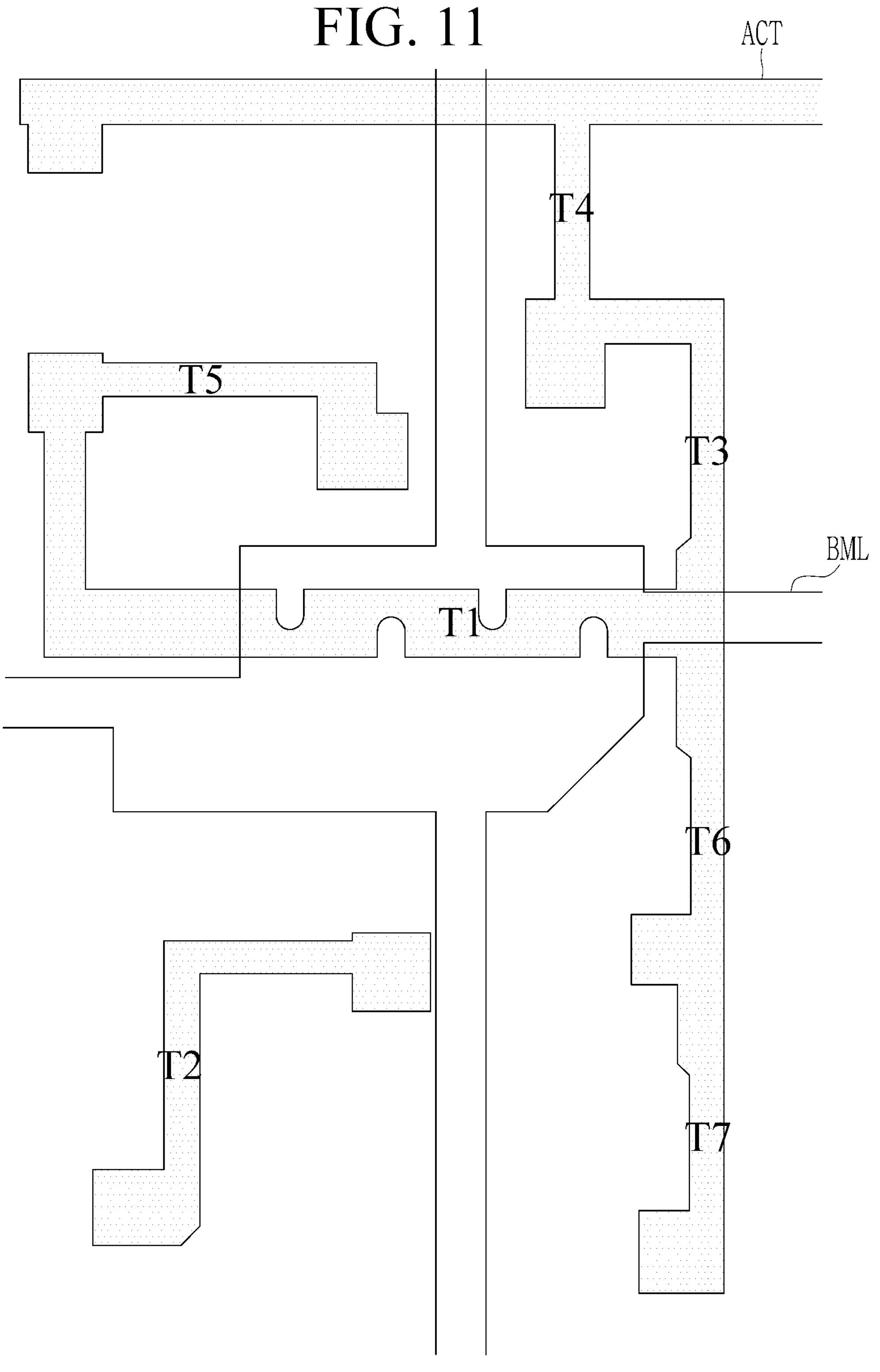
FIGS. 11 to 16 are schematic views showing a stacked structure of a pixel according to an embodiment of the disclosure step by step.

Referring to FIGS. 11 and 17, a light blocking layer BML may be positioned on a substrate SUB. A barrier layer BA may be positioned on the light blocking layer BML, and a semiconductor layer ACT may be positioned on the barrier layer BA. The semiconductor layer ACT may have regions that constitute a driving transistor T1, a second transistor T2, a third transistor T3, a fourth transistor T4, a fifth transistor T5, a sixth transistor T6, and a seventh transistor T7, respectively. The semiconductor layer ACT may include a polycrystalline semiconductor layer.

The shape of the driving transistor T1 may be the same as described above. For example, the driving transistor T1 may be linear with an I-shape that is not bent, and grooves G may be formed in the channel of the driving transistor T1. The shape and size of the driving transistor T1 and the W/L ratio of the channel C1 of the driving transistor T1 may be the same as described above. Thus, detailed descriptions of the same constituent elements are omitted.

Figure 12:
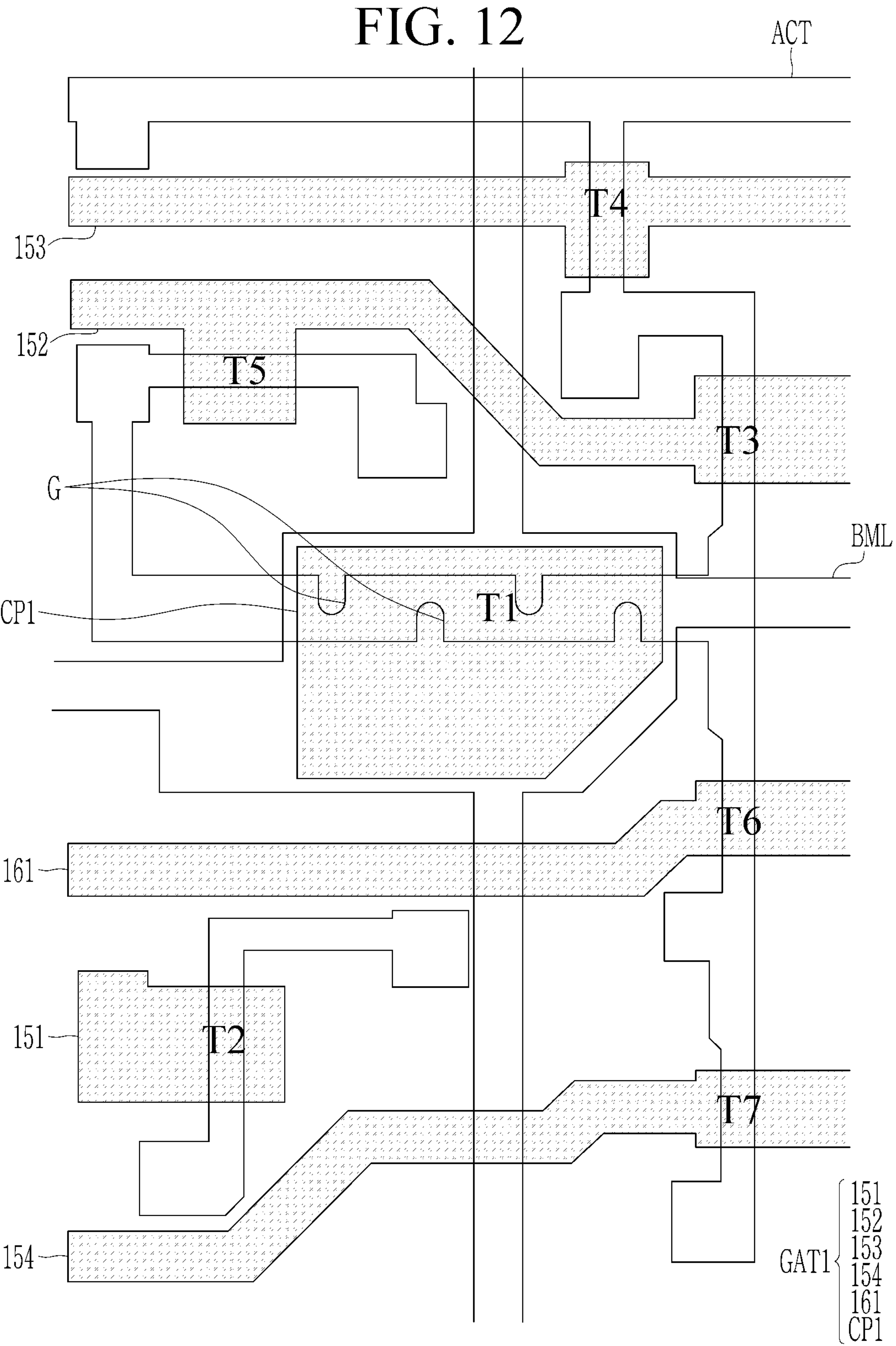

Referring to FIGS. 12 and 17, a buffer layer BUF and a first gate conductive layer GAT1 may be positioned on the semiconductor layer ACT. The buffer layer BUF may include at least one of a silicon oxide (SiOx), a silicon nitride (SiNx), a silicon oxynitride (SiOxNy), and amorphous silicon (Si).

The first gate conductive layer GAT1 may include a first scan pattern 151 receiving a first scan signal GW, a second scan line 152 transmitting a second scan signal GC, a third scan line 153 transmitting a third scan signal GI, a fourth scan line 154 transmitting a fourth scan signal GB, a light emission signal line 161 transmitting a light emission control signal EM, and a first storage pattern CP1 overlapping the driving transistor T1 in a plan view. The first gate conductive layer GAT1 may include at least one of molybdenum (Mo), aluminum (Al), copper (Cu), and titanium (Ti), and may have a single-layer or multi-layered structure including the above-described materials.

Figure 13:
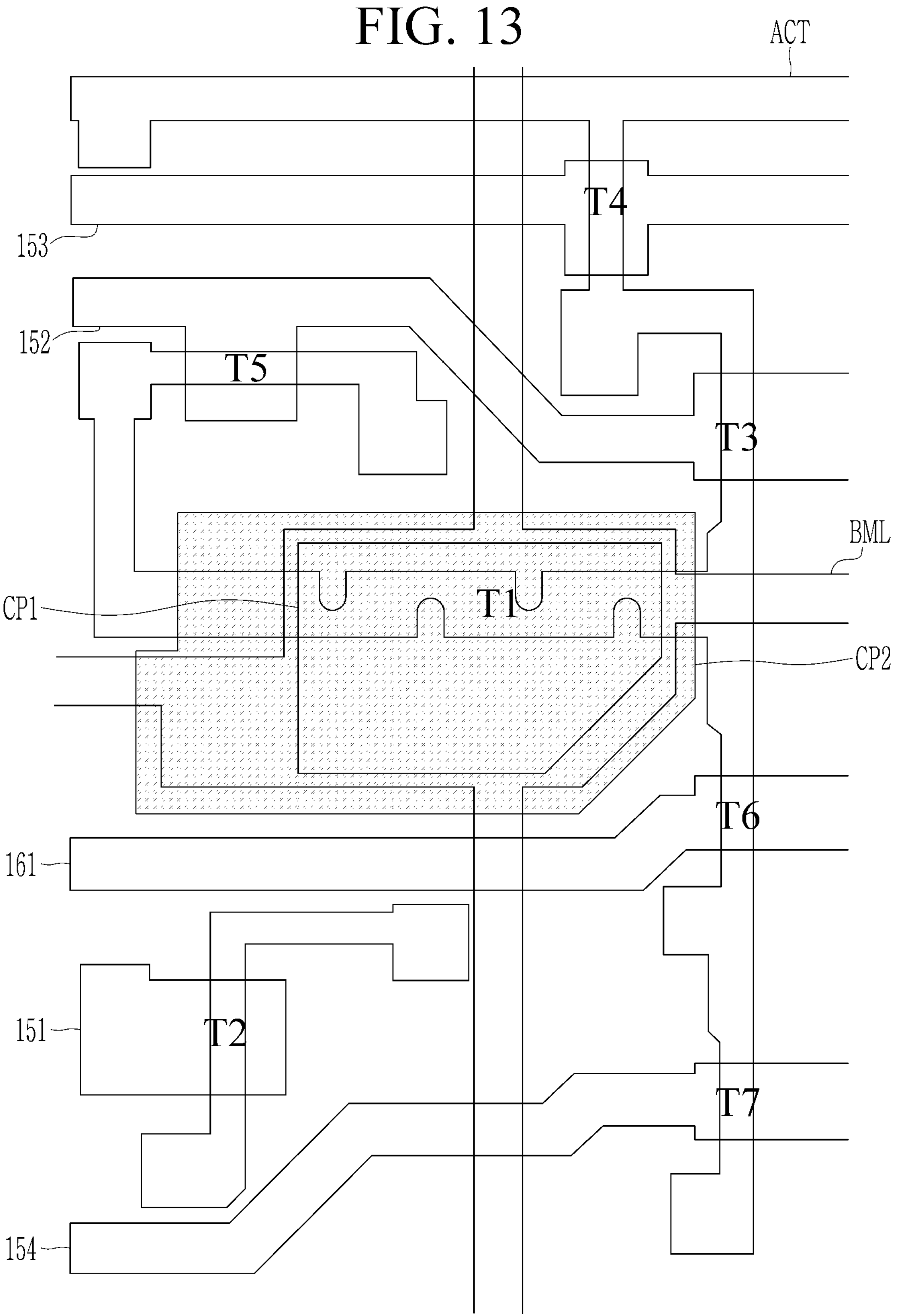

As shown in FIG. 13, the semiconductor layer ACT may be doped using the first gate conductive layer GAT1 as a mask. Therefore, the semiconductor layer ACT that does not overlap the first gate conductive layer GAT1 in a plan view may be doped. The region of the semiconductor layer ACT that is not doped by overlapping the first gate conductive layer GAT1 in a plan view may become a channel.

Referring to FIGS. 13 and 17, a first gate insulating layer GIL1 and a second gate conductive layer GAT2 may be positioned on the first gate conductive layer GAT1. The first gate insulating layer GIL1 may include at least one of a silicon oxide (SiOx), a silicon nitride (SiNx), and a silicon oxynitride (SiOxNy), and may have a single-layer or multi-layered structure including the above-described materials. The second gate conductive layer GAT2 may include at least one of molybdenum (Mo), aluminum (Al), copper (Cu), silver (Ag), chromium (Cr), tantalum (Ta), and titanium (Ti), and may be a single layer or multi-layered structure. However, the disclosure is not limited thereto.

The second gate conductive layer GAT2 may include a second storage pattern CP2 overlapping the first storage pattern CP1 in a plan view. The first storage pattern CP1 and the second storage pattern CP2 may constitute a storage capacitor $C_{ST}$.

Figure 14:
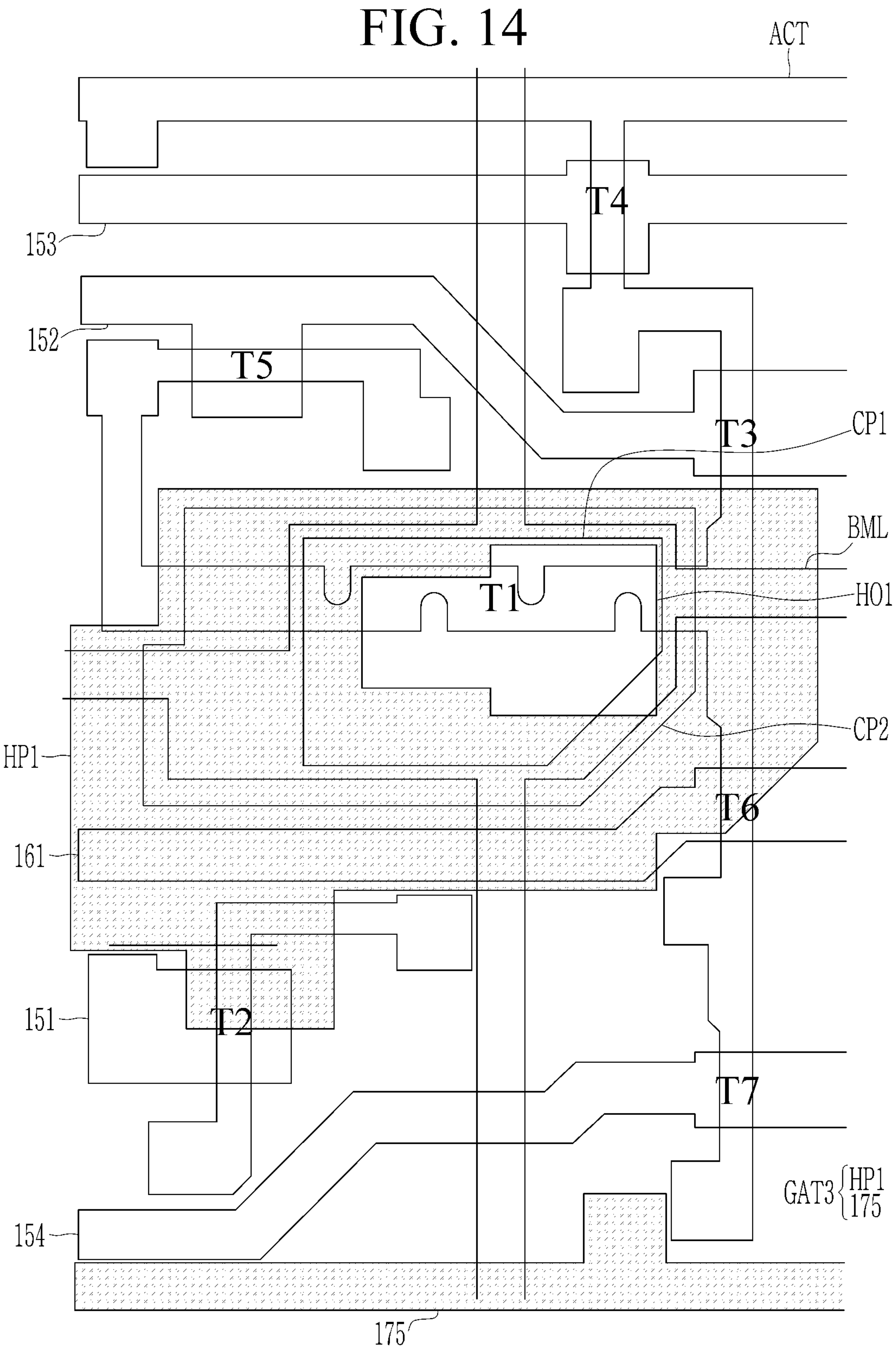

Referring to FIGS. 14 and 17, a second gate insulating layer GIL2 and a third gate conductive layer GAT3 may be positioned on the second gate conductive layer GAT2. The third gate insulating layer GIL3 may include at least one of a silicon oxide (SiOx), a silicon nitride (SiNx), and a silicon oxynitride (SiOxNy), and may have a single-layer or multi-layered structure including the above-described materials. The third gate conductive layer GAT3 may include at least one of molybdenum (Mo), aluminum (Al), copper (Cu), and titanium (Ti), and may have a single-layer or multi-layered structure including the above-described materials.

The third gate conductive layer GAT3 may include a second initialization voltage line 175 that transmits the second initialization voltage $AV_{INT}$ and a first hold pattern HP1 constituting an electrode of the hold capacitor $C_{HOLD}$. The first hold pattern HP1 may include a first hold opening HO1 positioned inside the first hold pattern HP1.

The first hold pattern HP1 and the second storage pattern CP2 may form the hold capacitor $C_{HOLD}$.

Figure 15:
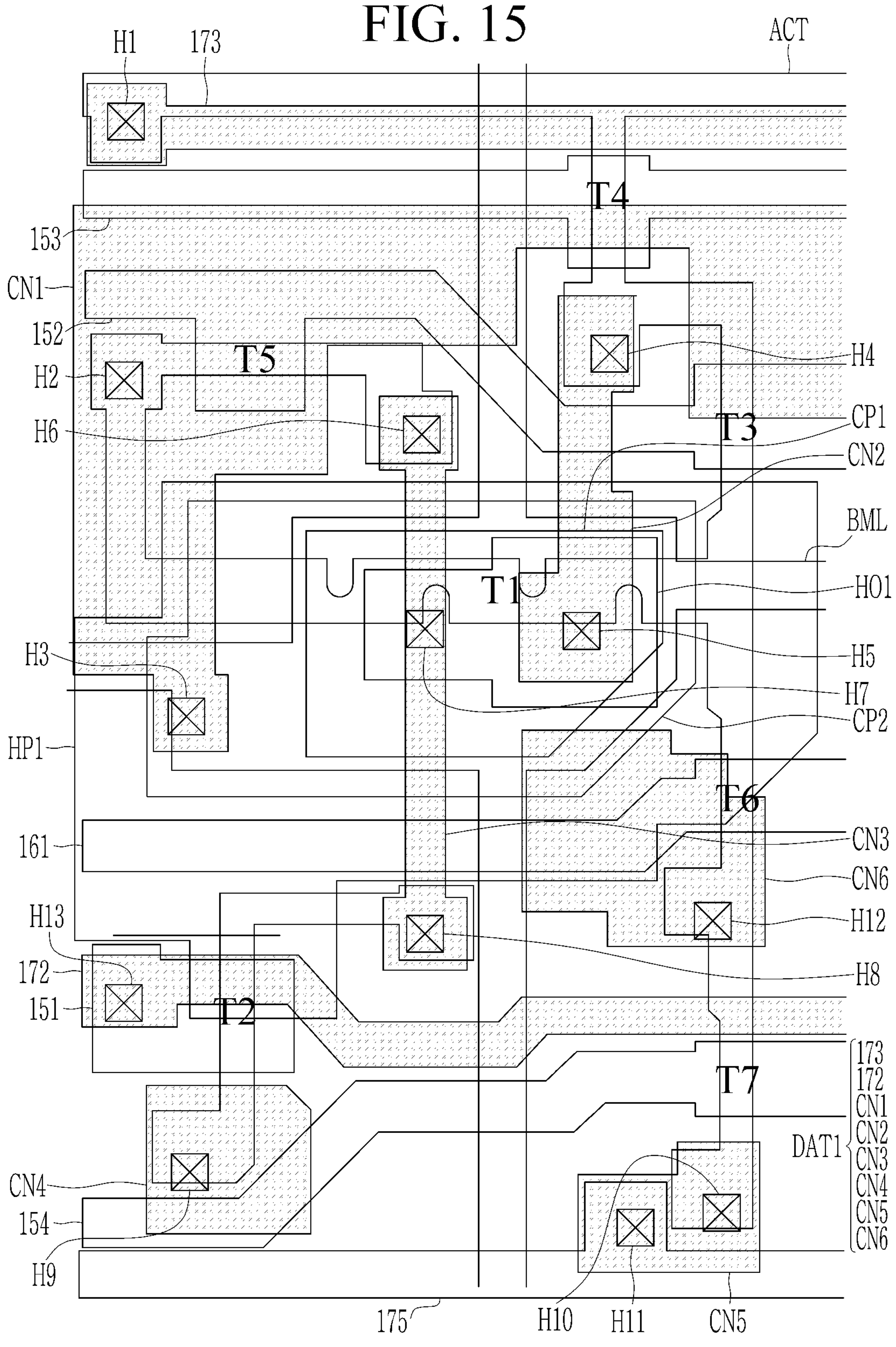

Referring to FIGS. 15 and 17, a first interlayer insulating layer ILD1 and a first data conductive layer DAT1 may be positioned on the third gate conductive layer GAT3. The first interlayer insulating layer ILD1 may include at least one of a silicon oxide (SiOx), a silicon nitride (SiNx), and a silicon oxynitride (SiOxNy), and may have a single-layer or multi-layered structure including the above-described materials. The first data conductive layer DAT1 may include at least one of aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu), and may be a single layer or a multi-layered structure including the above-described materials.

The first data conductive layer DAT1 may include a first initialization voltage line 173 transmitting the first initialization voltage $V_{INT}$, a first scan signal line 172 transmitting the first scan signal GW, a first connection pattern CN1, a second connection pattern CN2, a third connection pattern CN3, a fourth connection pattern CN4, a fifth connection pattern CN5, and a sixth connection pattern CN6.

The first initialization voltage line 173 may be electrically connected to the semiconductor layer ACT through the first contact hole H1 and transmit the initialization voltage $V_{INT}$ to the fourth transistor T4.

The first connection pattern CN1 may be electrically connected to an electrode of the fifth transistor T5 through the second contact hole H2. The first connection pattern CN1 may be electrically connected to the first hold pattern HP1 of the third gate conductive layer GAT3 through the third contact hole H3.

The second connection pattern CN2 may be electrically connected to the semiconductor layer ACT through the fourth contact hole H4. The second connection pattern CN2 may be electrically connected to the second storage pattern CP2 through the fifth contact hole H5. For example, the second connection pattern CN2 may electrically connect the third transistor T3 and the storage capacitor $C_{ST}$ to each other.

The third connection pattern CN3 may be electrically connected to the semiconductor layer ACT of the fifth transistor T5 through the sixth contact hole H6, and may be electrically connected to the second storage pattern CP2 through the seventh contact hole H7. Also, the third connection pattern CN3 may be electrically connected to the semiconductor layer ACT of the second transistor T2 through the eighth contact hole H8. For example, the third connection pattern CN3 may electrically connect the fifth transistor T5, the second transistor T2, and the storage capacitor $C_{ST}$.

The fourth connection pattern CN4 may be electrically connected to the semiconductor layer of the second transistor T2 through the ninth contact hole H9.

The fifth connection pattern CN5 may be electrically connected to the semiconductor layer of the seventh transistor T7 through the tenth contact hole H10 and may be electrically connected to the second initialization voltage line 175 through the eleventh contact hole H11. Therefore, the fifth connection pattern CN5 may transmit the second initialization voltage of the second initialization voltage line 175 to the seventh transistor T7.

The sixth connection pattern CN6 may be electrically connected to the semiconductor layer of the sixth transistor T6 through the twelfth contact hole H12.

The first scan signal line 172 may be electrically connected to the first scan pattern 151 of the first gate conductive layer through the thirteenth contact hole H13. Therefore, the first scan signal GW may be transmitted to the gate electrode of the second transistor T2.

Figure 16:
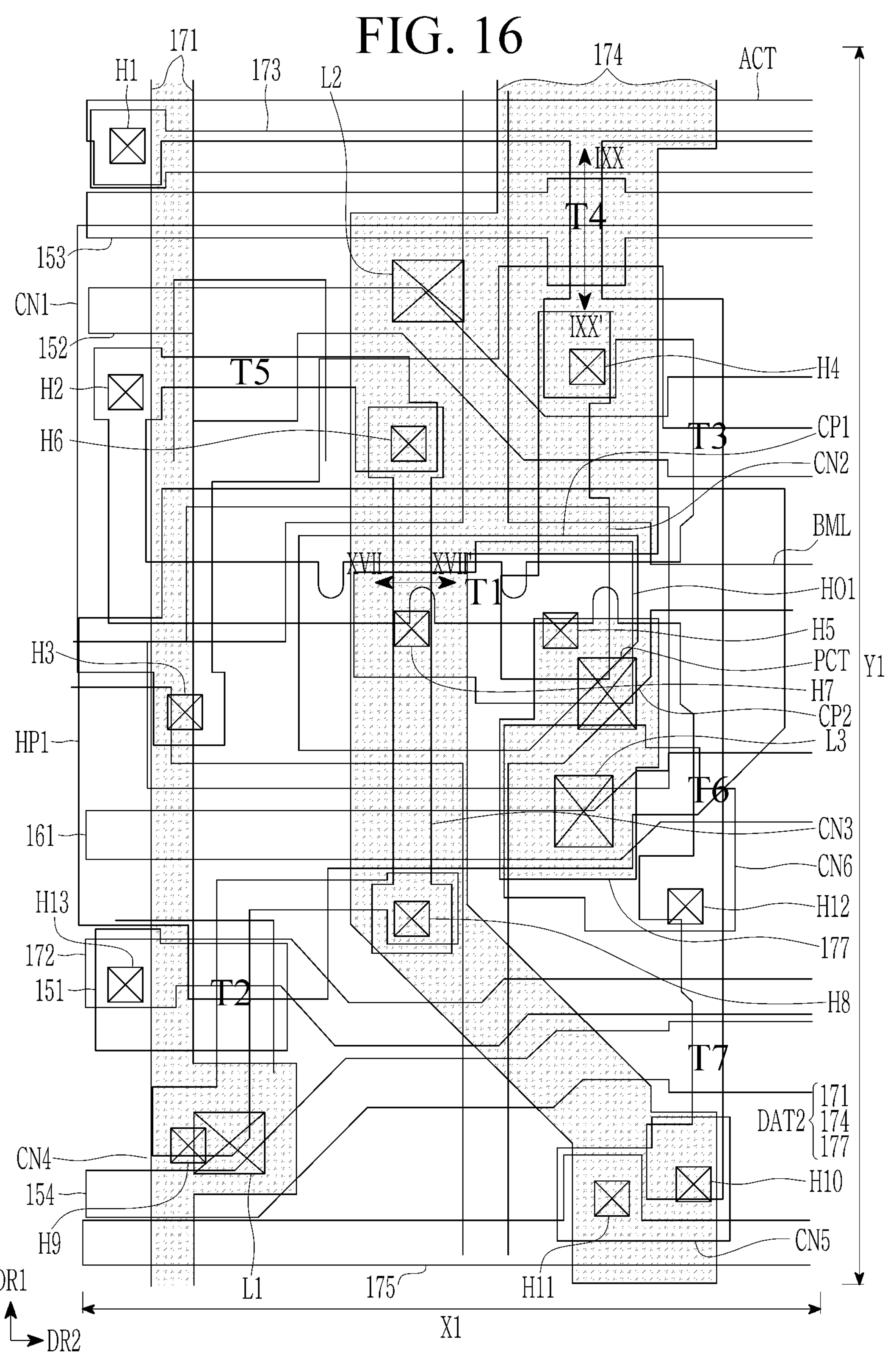
Figure 17:
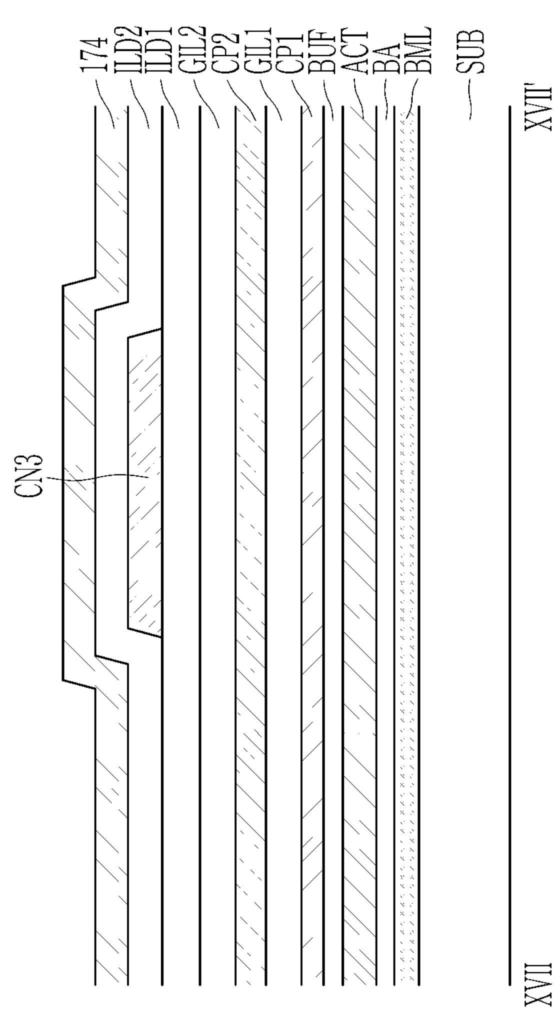
FIG. 17 is a schematic cross-sectional view taken along line XVII-XVII' of FIG. 16.

Referring to FIGS. 16 and 17, a second interlayer insulating layer ILD2 and a second data conductive layer DAT2 may be positioned on the first data conductive layer DAT1. The second interlayer insulating layer ILD2 may include at least one of a silicon oxide (SiOx), a silicon nitride (SiNx), and a silicon oxynitride (SiOxNy), and may have a single-layer or multi-layered structure including the above-described materials. The second data conductive layer DAT2 may include at least one of aluminum (Al), platinum (Pt), palladium (Pd), silver (Ag), magnesium (Mg), gold (Au), nickel (Ni), neodymium (Nd), iridium (Ir), (Cr) chromium, nickel (Ni), calcium (Ca), molybdenum (Mo), titanium (Ti), tungsten (W), and copper (Cu), and may be a single-layer or a multi-layered structure including the above-described materials.

The second data conductive layer DAT2 may include the data line 171, the driving voltage line 174, and a data connection pattern 177.

The data line 171 may be electrically connected to the fourth connection pattern CN4 through the twenty-first contact hole L1. Since the fourth connection pattern CN4 is electrically connected to the second transistor T2, the data voltage DATA of the data line may be transferred to the second transistor T2.

The driving voltage line 174 may be electrically connected to the first connection pattern CN1 through the twenty-second contact hole L2. The first connection pattern CN1 may be electrically connected to an electrode of the fifth transistor T5 through the second contact hole H2, and the driving voltage ELVDD may be transferred to the fifth transistor.

The first connection pattern CN1 may be electrically connected to the first hold pattern HP1 of the third gate conductive layer GAT3 through the third contact hole H3, and the driving voltage ELVDD may be transferred to an electrode of the hold capacitor $C_{HOLD}$.

The data connection pattern 177 may be electrically connected to the sixth connection pattern CN6 through the twenty-third contact hole L3. The sixth connection pattern CN6 may be electrically connected to the semiconductor layer of the sixth transistor T6 through the twelfth contact hole H12.

Although not shown, an insulating layer may be positioned on the second data conductive layer DAT2. The insulating layer may include an organic insulating material. The organic insulating material of the insulating layer may include a generally-used polymer such as poly(methyl methacrylate) (PMMA) or polystyrene (PS), or a polymer derivative having at least one of a phenol-based group, an acryl-based polymer, an imide-based polymer, a polyimide, an acryl-based polymer, and a siloxane-based polymer.

The insulating layer may include a pixel contact hole PCT. A light emitting diode (LED) may be positioned on the insulating layer. The data connection pattern 177 may be electrically connected to the light emitting diode (LED) (not shown) through the pixel contact hole PCT. The data connection pattern 177 may electrically connect the sixth transistor T6 and the light emitting diode (LED), and accordingly, the sixth transistor T6 may transmit the output current of the driving transistor T1 to the light emitting diode LED based on the light emission control signal EM.

FIG. 16 schematically shows the arrangement diagram of a pixel including seven transistors and two capacitors. A length Y1 of a pixel in the first direction DR1 may be about 70 μm or less, and a length X1 of the pixel in the second direction DR2 may be about 35 μm or less.

For example, the length Y1 of the pixel in the first direction DR1 may be in a range of about 40 μm to about 70 μm, and the length X1 of the pixel in the second direction DR2 may be in a range of about 10 μm to about 35 μm.

For example, in the display device according to the embodiment, the driving transistor may have the linear shape in which grooves are formed. Thus, even in case that the size of the pixel is reduced at high resolution, the edge current effect may be minimized and the display device may be driven stably.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
- a semiconductor layer positioned on a substrate, the semiconductor layer including:
  - a driving transistor; and
  - a plurality of transistors;
- a gate conductive layer positioned on the semiconductor layer; and
- a data conductive layer positioned on the gate conductive layer,
- wherein a region of the semiconductor layer in which the driving transistor overlaps the gate conductive layer in a plan view forms a channel of the driving transistor,
- wherein the driving transistor has a linear shape, and
- wherein a plurality of grooves are formed in the channel of the driving transistor.

2. The display device of claim 1, wherein
- a ratio of a width of the channel of the driving transistor in a first direction to a length of the channel of the driving transistor in a second direction perpendicular to the first direction is in a range of about 1:3 to about 1:5.

3. The display device of claim 2, wherein the width of the channel of the driving transistor in the first direction is about 4 μm or less.

4. The display device of claim 2, wherein the length of the channel of the driving transistor in the second direction is in a range of about 8 μm to about 12 μm.

5. The display device of claim 2, wherein the width of the channel of the driving transistor in the first direction is in a range of about 2.5 μm to about 4 μm.

6. The display device of claim 1, wherein the plurality of grooves are alternately formed along edges of the driving transistor.

7. The display device of claim 6, wherein a width of each of the plurality of grooves in a second direction is in a range of about 1 μm to about 2 μm.

8. The display device of claim 6, wherein a length of each of the plurality of grooves in a first direction is in a range of about 1 μm to about 2.5 μm.

9. The display device of claim 6, wherein in the linear shape in which the plurality of grooves are formed, a width of the driving transistor in a first direction is shorter than a length of each of the plurality of grooves in the first direction.

10. The display device of claim 6, wherein a length of each of the plurality of grooves in a first direction is longer than a half of a width of the driving transistor in the first direction.

11. The display device of claim 1, wherein the plurality of grooves include a circular groove positioned in a center of the channel of the driving transistor.

12. The display device of claim 11, wherein a diameter of the circular groove is in a range of about 1 μm to about 3 μm.

13. The display device of claim 11, wherein the plurality of grooves include a semicircular groove positioned at an edge of the driving transistor.

14. The display device of claim 13, wherein a diameter of the semicircular groove is in a range of about 2 μm to about 4 μm.

15. The display device of claim 11, wherein the driving transistor comprises:

a region in which a current is concentrated; and a region in which the current is not concentrated, and the region in which the current is concentrated and the region in which the current is not concentrated alternate with each other.

16. The display device of claim 1, further comprising:

a light blocking layer positioned between the substrate and the semiconductor layer.

17. The display device of claim 16, wherein the plurality of transistors include:

a first transistor;

a second transistor;

a third transistor;

fourth transistor;

a fifth transistor; and a sixth transistor, and wherein the driving transistor, the first transistor, the second transistor, the third transistor, the fourth transistor, the fifth transistor, and the sixth transistor are included in a pixel.

18. The display device of claim 17, wherein a length of the pixel in a second direction is about 35 μm or less.

19. The display device of claim 17, wherein a length of the pixel in a first direction is about 70 μm or less.

20. The display device of claim 17, further comprising:

a light-emitting element electrically connected to the sixth transistor.

* * * * *